United States Patent
Brune

[19]

[11] Patent Number: 5,920,461
[45] Date of Patent: Jul. 6, 1999

[54] SURFACE MOUNT POWER SUPPLY DEVICE

[75] Inventor: Peter T. Brune, Vista, Calif.

[73] Assignee: Lambda Electronics, Inc., Melville, N.Y.

[21] Appl. No.: 08/854,523

[22] Filed: May 12, 1997

[51] Int. Cl.$^6$ .......................... H05K 01/14; H01R 04/09
[52] U.S. Cl. .................. 361/760; 361/751; 361/306.1; 361/768; 361/777; 174/260; 174/261; 174/255; 439/65; 439/75; 439/83
[58] Field of Search ...................... 361/760, 751, 361/306.1, 768, 777; 174/260, 261, 255; 439/65, 75, 83

[56] References Cited

U.S. PATENT DOCUMENTS

| | | | |
|---|---|---|---|
| 4,330,683 | 5/1982 | Parker | 174/52.2 |
| 4,754,366 | 6/1988 | Hernandez | 361/306.2 |
| 5,117,330 | 5/1992 | Miazga | 361/760 |
| 5,272,590 | 12/1993 | Hernandez | 361/306.2 |
| 5,311,395 | 5/1994 | McGaha et al. . | |
| 5,313,021 | 5/1994 | Sajja et al. | 174/260 |
| 5,339,217 | 8/1994 | Cohen et al. . | |
| 5,455,741 | 10/1995 | Wai et al. . | |
| 5,612,855 | 3/1997 | Heeb et al. . | |
| 5,613,033 | 3/1997 | Swamy et al. | 361/790 |
| 5,615,087 | 3/1997 | Wieloch . | |

FOREIGN PATENT DOCUMENTS 35 42 464  6/1986  Germany .

*Primary Examiner*—Leo P. Picard
*Assistant Examiner*—David Foster
*Attorney, Agent, or Firm*—Morgan & Finnegan, LLP

[57] ABSTRACT

The present invention relates to a method and apparatus for manufacturing a surface mount power supply device having effective thermal management. The surface mount power supply device comprises a printed circuit board mounted to a thermal plastic lead frame attach by means of vertically-extending aluminum pins embedded in the lead frame attach. A cylindrical member is centered within the lead frame attach by means of inwardly protruding arms transversely connected to the lead frame attach to allow for a pick-and-place operation.

10 Claims, 3 Drawing Sheets

SURFACE MOUNT POWER SUPPLY DEVICE

BACKGROUND OF THE INVENTION

1. Field of the Invention

The present invention relates generally to surface mount device ("SMD") technology and more particularly to a surface mount power supply device having high thermal performance.

2. Description of the Related Art

For many years, the fabrication of an electronic circuit board was accomplished by the "through-hole" method. This method involved interconnecting electronic components on a planar printed circuit board ("PCB") typically comprised of an epoxy/fiberglass laminate substrate clad with an etched sheet of copper to delineate conductive paths. Holes were drilled at the ends of the conductive paths to receive leads of components ("through-hole devices") which were subsequently soldered thereto.

Recently, SMD technology has emerged to allow for more efficient automatic mass production of PCB's with higher component densities. Package components are automatically placed at preselected locations on top of a PCB in such a manner that their leads are aligned with and lie on top of corresponding solder pads. The components are then soldered to the PCB by a soldering process, such as vapor phase soldering, reflow soldering or infrared soldering, to thereby establish a permanent electrical connection between the leads and their corresponding conductive paths.

SMD technology has many advantages over through-hole technology. Most importantly, it avoids the necessity for drilled holes and allows components to be attached to both sides of a PCB. Other important advantages of SMD technology include speed of assembly, greater reliability of components and the availability of large-scale soldering methods. Despite these advantages, the exclusive use of surface mount technology at the PCB assembly level has been stymied by a limited accessibility to certain components that are not yet readily available as SMD's.

Five to thirty watt dc-to-dc converter power supplies are components that are presently not available in surface mount packages. Currently, dc-to-dc converter power supplies are through-hole devices that require different and more costly assembly methods from conventional SMD methods. These devices are commonly used in telecommunication switches, network devices, mainframe computers and minicomputers. Lack of availability of SMD dc-to-dc converters ultimately has prevented manufacturers from realizing the full potential of cost savings from automatic SMD operations. Surface-mountable dc-to-dc converters have been presently available only as custom-built components or standard components in a limited set of inputs and outputs. Switching to surface-mount for dc-to-dc converters would be especially desirable where SMD is already widely used, as in telecommunications, computers, wireless cellular base stations, computer mainframes or work stations. However, weight has been the chief obstacle in constructing these devices to be surface-mountable. An SMD needs to be light enough to be handled by surface mount pick-and-place equipment, but encapsulation and other techniques necessary for effective thermal dissipation have not allowed adequate weight reductions.

It is therefore an object of the present invention to provide a surface-mountable power supply device by making the necessary reductions in component weight for pick-and-place operations while still allowing for effective thermal dissipation.

SUMMARY OF THE INVENTION

According to the present invention, the foregoing and other objects are attained by a surface mount power supply device having effective thermal management.

The surface mount power supply device generally includes a PCB mounted to a lead frame attach by means of a plurality of vertically extending "L"-shaped pins. Rectangular surfaces on the heads of the pins come into contact with a customer PCB to form electrical connections.

The PCB is comprised of a thermally conductive material referred to as T-LAM™ and the lead frame attach is comprised of thermal plastic. With this structure, heat is dissipated mostly upward and away from the PCB and the sides via the pins. The result is effective thermal dissipation with minimal and even heat rise on the PCB.

For pick-and-place operation, a cylindrical member is disposed within the lead frame attach to simulate a bottom surface, and is connected by protruding arms to side members of the lead frame attach.

BRIEF DESCRIPTION OF THE DRAWINGS

The foregoing features and other aspects of the invention are explained in the following description taken in connection with the accompanying drawings, wherein.

DETAILED DESCRIPTION

Figure 1:
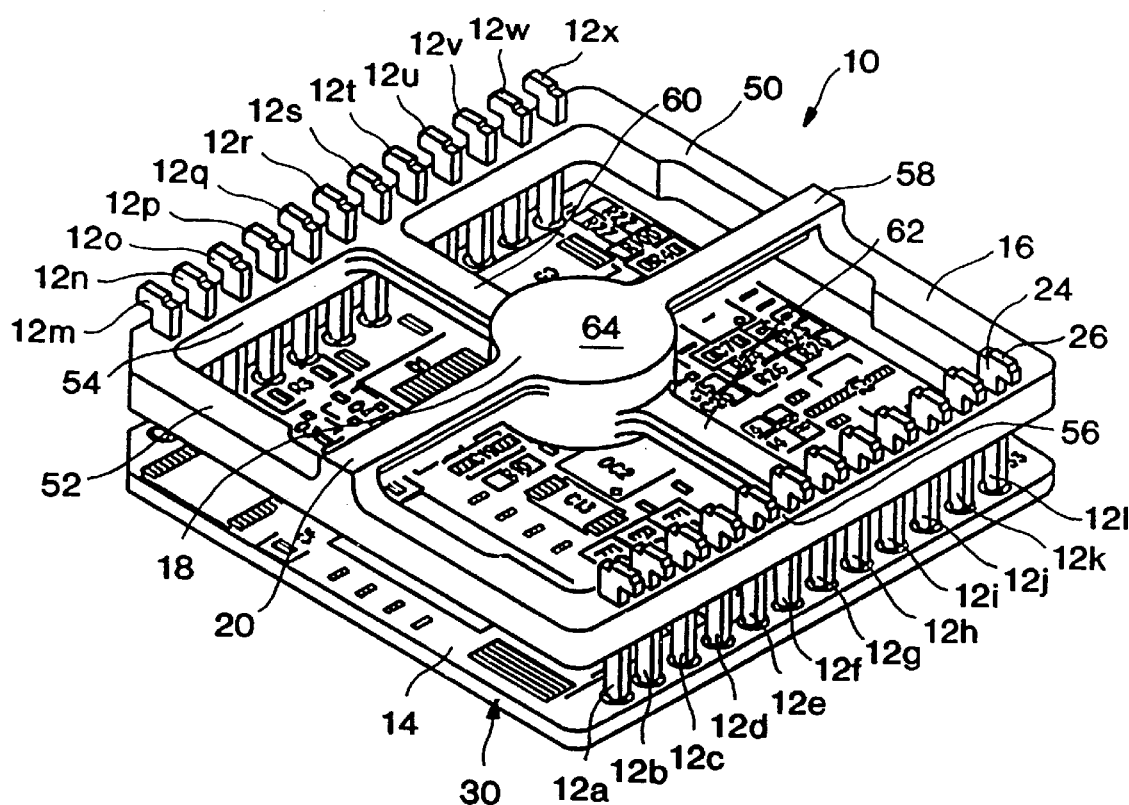
FIG. 1 is a perspective view of the surface mount power supply device according to one embodiment of the present invention.
Figure 2:
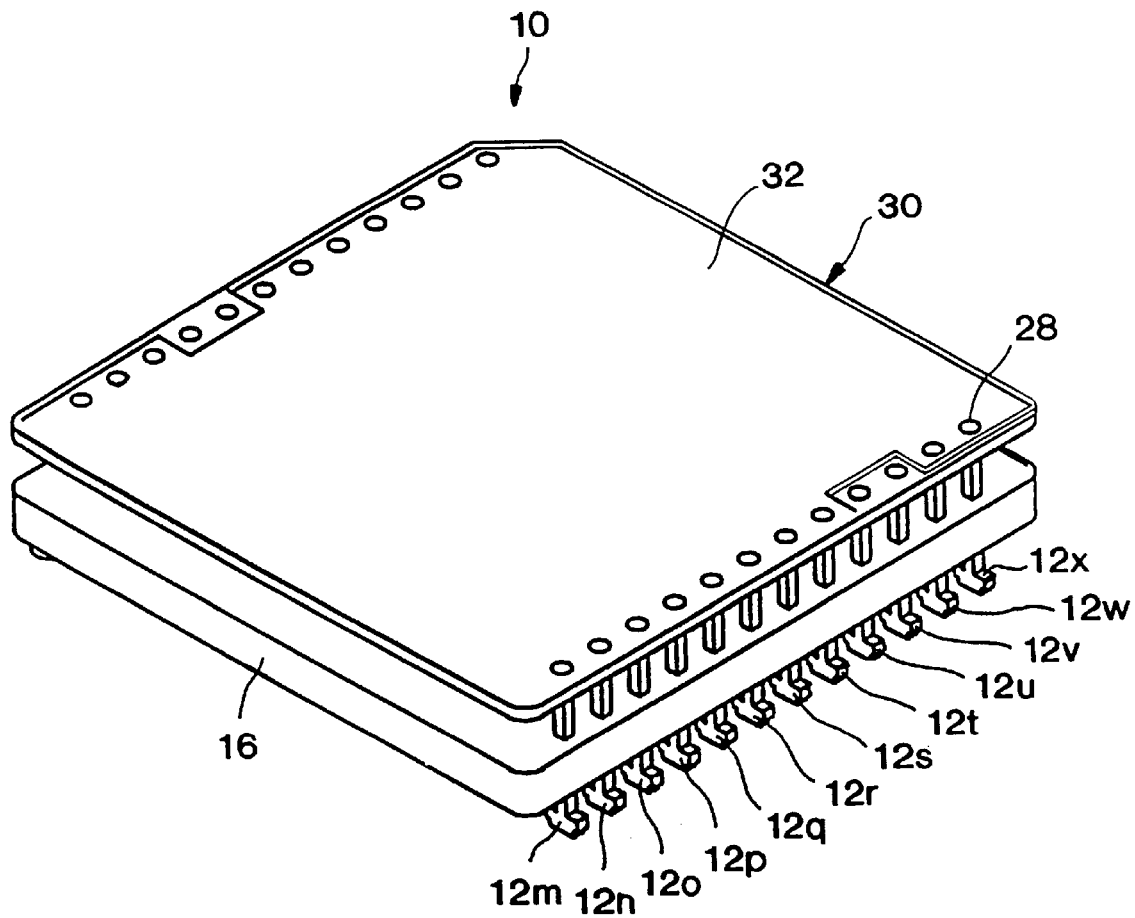
FIG. 2 is a bottom view of the surface mount power supply device of FIG. 1.

Referring to FIGS. 1 and 2, a surface mount power supply device 10 according to the present invention is shown. The power supply device 10 generally includes a PCB 30 mounted to a lead frame attach 16 by means of a plurality of metallic pins 12a–12x.

The PCB 30 has a top surface 14 and a bottom surface 32 and is comprised of a thermally conductive material referred to as the T-LAM™ system by Thermagon, Inc., of Cleveland, Ohio. The T-Lam™ system includes an Insulated Metal Printed Circuit Board (IMPCB™) laminate, T-preg™ dielectric, and Double-Sided Laminate (DSL™) materials for multilayer boards.

The IMPCB™ laminate, which provides the raw material for single-sided surface mount PCBs as with the present invention, contains a metal base plate layer, a thermally conductive T-preg™ layer, and a copper foil circuitry layer which comprises the top surface 14 of the PCB 30. The IMPCB™ laminate is capable of dissipating many times more heat than its conventional FR-4 counterpart used in prior art power supply devices. In many configurations, the IMPCB™ can also outperform alumina in heat dissipating capacity. Moreover, the pure copper traces provide better current carrying capability than alumina thick film circuits. The copper foil circuitry layer is high ductility, electrode-posited copper. The metal base plate of the IMPCB™ laminate may be made of various materials including aluminum, copper or copper-molybdenum-copper. In the present embodiment, the metal base plate is a copper heat spreader on the bottom surface 32 of the PCB 30.

The T-preg™ layer serves as the bonding agent for laminating the copper circuitry layer to the heat dissipating metal base plate, and possesses high dielectric strength and low capacitance. The T-preg™ layer serves three major functions: (1) heat conduction; (2) electrical isolation; and (3) adhesion.

T-LAM™ has a very good thermal conductivity allowing for a single-sided PCB design. More importantly, thermal resistance of T-LAM™ is approximately 0.04–0.06° C.-in$^2$/W, vastly superior to that of the conventional FR-4 of approximately 8.3° C.-in$^2$/W. The copper heat spreader will dissipate thermal losses into the localized environment through natural convection. Superior thermal performance is also due to the additional surface area of the pins. This aids in better distribution of thermal losses to the localized environment and away from the customer's PCB.

The lead frame attach 16 is a rectangular structure having parallel side members 50 and 52 connected transversely at their ends to parallel side members 54 and 56. The lead frame attach 16 is a custom molded-injected pin carrier comprised of thermal plastic and having pins 12a–12l embedded on side member 56 of the structure and pins 12m–12x embedded on side member 54 of the structure. The lead frame attach 16 further comprises a thermal plastic cylindrical member 18 at its center having protruding arms 20, 58, 60 and 62. Arms 60 and 62 extend from a vertical midpoint of the cylindrical structure 18 and connect transversely to the side members 54 and 56, respectively. Arms 20 and 58 extend perpendicularly planar from the top surface 64 of the cylindrical member 18 and connect at points overlapping side members 52 and 50, respectively.

The cylindrical member 18 is essential for a pick-and-place operation with conventional pick-and-place machinery. Conventional pick-and-place machinery will not pick-and-place a component unless it detects a bottom element, such as the bottom surface of a prior art encapsulated component having a "box"-like structure. The cylindrical member 18 is configured to be just large enough for the pick-and-place machinery to detect a bottom surface without adding unnecessary weight to the power supply device 10.

Each pin 12a–12x comprises an "L"-shaped structure having a vertically extending shaft terminating in a pin head 24 with elevated contact members 26 having rectangular surface areas which come into contact with a customer's PCB to form electrical connections. As will be discussed in more detail below, the ends of the pins 12a–12x opposite the pin heads 24 are soldered into pin holes 28 drilled into the PCB 30.

In one example of the invention, the device 10 is 1.4 inches long by 1.4 inches wide by 0.35 inches thick, produces a nominal output power of 10 Watts and a power density of 14.58 in$^3$ and has a % Delta of –2.0/+2.4% in$^2$/in$^3$. In a second example, the power supply device 10 is 1.9 inches long by 1.9 inches wide by 0.35 inches thick, produces a nominal output power of 20 Watts and a power density of 15.83 W/in$^3$ and has a % Delta of +12.8/17.9% in$^2$/in$^3$. In a third example, the power supply device 10 is 2.5 inches long by 2.5 inches wide by 0.35 inches thick, produces a nominal output power of 30 Watts and a power density of 13.71 W/in$^3$, and has a % Delta of –16.7/–12.9% in$^2$/in$^3$.

The process for manufacturing the power supply device 10 is as follows. A manufacturer starts with a T-LAM™ PCB 30 and surface mounts components onto the top surface 14 of the PCB 30 with high speed placement and reflow. The lead frame attach 16 is mounted via alignment pins (not shown) by inserting pins 12a–12x into holes 28 drilled into the PCB 30 while providing a consistent height for the pins 12a–12x to be reflowed with the rest of the components. As a final step, an optional conformal coating, spray or dip is automatically deposited on both sides of the PCB 30.

Figure 3:
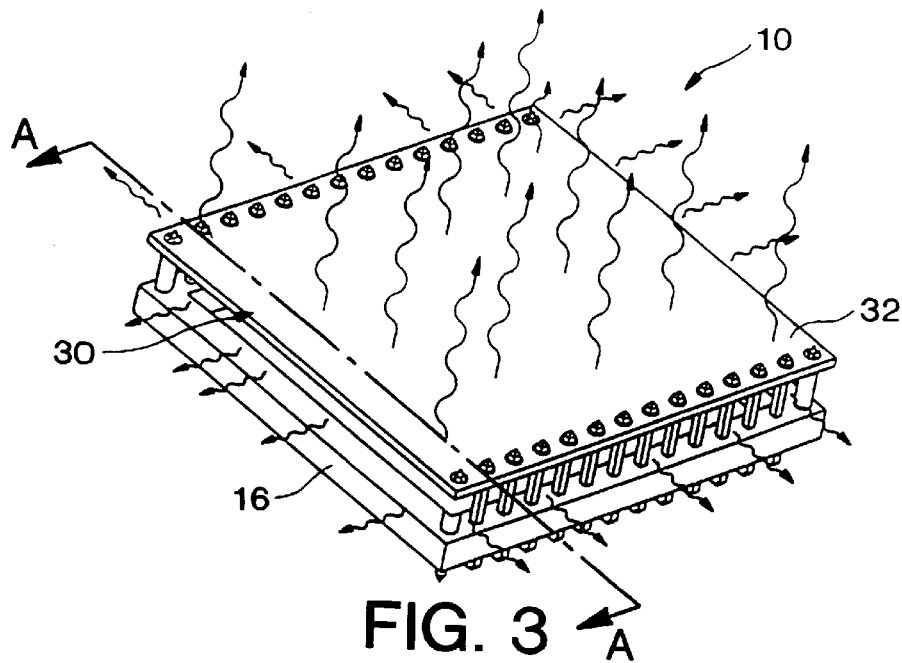
FIG. 3 is a bottom view of the surface mount power supply device of FIG. 1 illustrating thermal dissipation.
Figure 4:
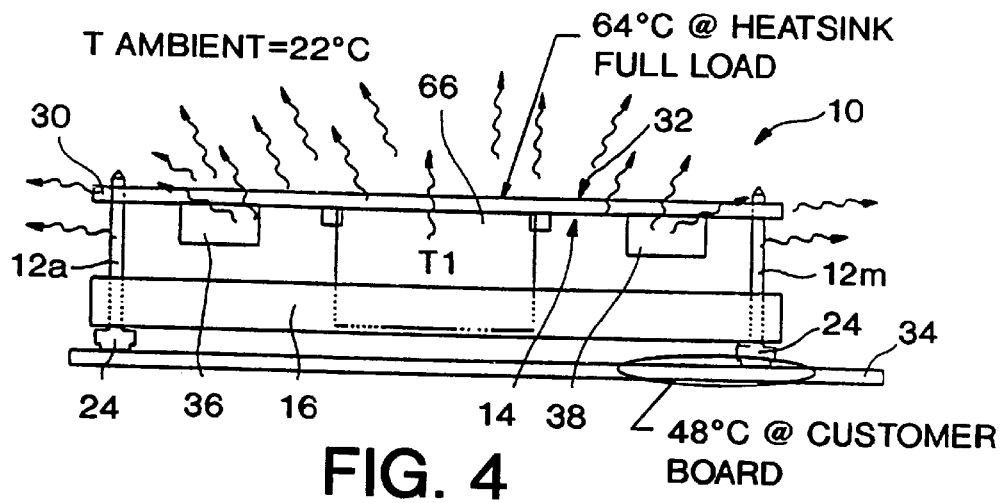
FIG. 4 is a cross-sectional view of the surface mount power supply device of FIG. 3 taken on line A—A.
Figure 5:
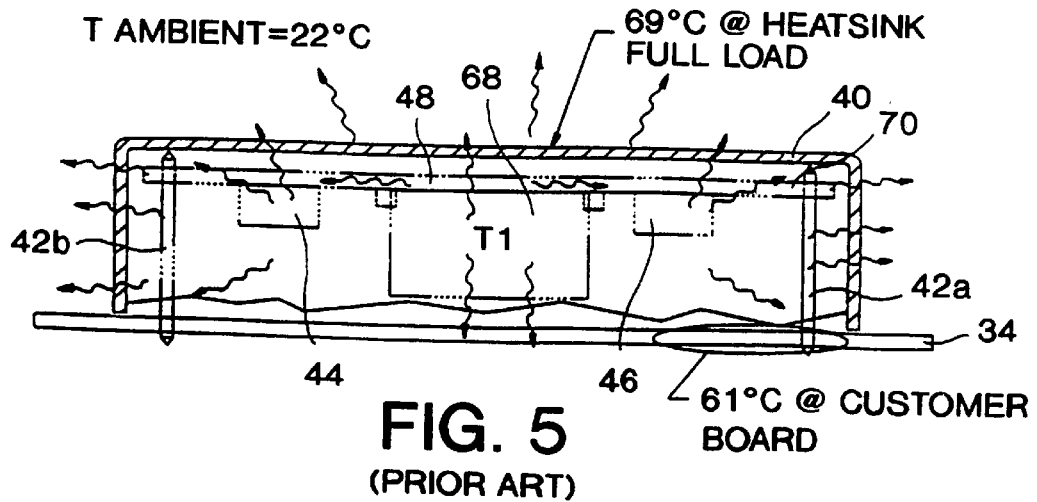
FIG. 5 is a cross-sectional view of a prior art through-hole power supply device illustrating thermal dissipation.

FIGS. 3–5 illustrate the superior thermal management of the power supply device 10 over the prior art.

Referring to FIG. 4, the power supply device 10 is shown having a pair of DPAK devices 36 and 38 and a device 66 mounted on the top surface 14 of the PCB 30. The rectangular surfaces of pin heads 24 of pins 12a and 12m are illustrated in contact with a customer PCB 34.

As shown in FIGS. 3 and 4, thermal management of the power supply device 10 is due to direct transfer of thermal losses from the two mounted DPAK devices 36 and 38 into the component copper layer, through the T-LAM™ dielectric material referred to as T-preg™, into the copper clad heat spreader on the opposite side of the board and dissipated out the 24 pins 12a–12x. Even distribution of thermal energy throughout the 24 pins 12a–12x cause minimal temperature rise at the customer's board 34. As shown in FIG. 4, at an ambient temperature of 22° C., the temperature at the customer's PCB 34 is 48° C.

Referring now to FIG. 5, a prior art encapsulated through-hole power supply device is shown. The through-hole power supply device comprises through-hole pins 42a and 42b connected to a PCB 70 comprised of FR-4 material and extending through the customer's PCB 34. DPAK devices 44 and 46 and device 68 are mounted on the surface of PCB 70. The PCB 70 is surrounded by box attach 40. As compared to the present invention, at an ambient temperature of 22° C., the temperature at the customer's PCB 34 is 61° C., i.e., an increase of 13° C.

There are many benefits to the power supply device 10 of the present invention. First, it allows the copper heat spreader on the bottom surface 32 of the PCB 30 to be facing upward or away from a customer's PCB 34, thereby minimizing the transfer of thermal energy back into the customer's PCB. Second, a box attach is not required due to the components facing downward and being somewhat protected by the lead frame attach 16. Third is the potential ability for the lead frame attach 16 to act as an EMI shield in conjunction with the copper heat spreader of the PCB 30. Finally, noncoplanarity (defined as the maximum distance between the lowest and highest pin when the finished package rests on a perfectly flat surface) is kept to a minimum in this configuration where the stable lead frame attach 16 can be used to isolate the PCB 30 from potential warpage during reflow.

Although illustrative preferred embodiments have been described herein in detail, it should be noted and will be appreciated by those skilled in the art that numerous variations may be made within the scope of this invention and without sacrificing its advantages. The terms and expressions have been used herein as terms of description and not terms of limitation. There is no intention to use the terms or expressions to exclude any equivalents of features shown and described or portions thereof and this invention should be defined in accordance with the claims which follow.

What is claimed is:

1. A surface mount device, comprising:
   a printed circuit board comprising a metal base plate having a top surface and a bottom surface, wherein the top surface of the printed circuit board comprises a copper foil circuitry attached to the metal base plate by a thermally conductive bonding agent, the top surface further having at least one electronic component disposed thereon; and a lead frame having a plurality of vertically-extending pins connected to a plurality of holes corresponding to each of the pins, the holes being located on the top surface of the printed circuit board;

wherein the pins of the lead frame further extend beyond the lead frame in a direction opposite to that of the printed circuit board for forming an electrical connection with a second printed circuit board.

2. The surface mount device of claim 1, wherein the copper foil circuitry is comprised of electrodeposited copper having high ductility, and the metal base plate is comprised of copper.

3. The surface mount device of claim 1, wherein the lead frame is comprised of thermal plastic.

4. The surface mount device of claim 1, wherein the lead frame comprises a rectangular frame having a cylindrical member positioned therebetween.

5. The surface mount device of claim 1, wherein the surface mount device is a five- to thirty-watt dc-to-dc converter power supply.

6. The surface mount device of claim 1, wherein the surface mount device has a weight no greater than the maximum allowable for being picked up and placed by a surface mount pick-and-place machine.

7. The surface mount device of claim 1, wherein each pin comprises a first end and a second end, the first end being connected with one of the holes and the second end having an arm extending transversely therefrom.

8. The surface mount device of claim 7, wherein the arm further comprises a member having a rectangular top surface vertically extending therefrom for contacting and forming the electrical connection with a corresponding solder pad of the second printed circuit board.

9. The surface mount device of claim 1, wherein the metal base plate is comprised of a material selected from the group consisting of aluminum, copper and copper-molybdenum-copper.

10. The surface mount device of claim 1, wherein the bonding agent is comprised of a material having a high dielectric strength and a low capacitance.

* * * * *